US 6,744,476 B1

(12) United States Patent
Kobayashi et al.

(10) Patent No.: US 6,744,476 B1
(45) Date of Patent: Jun. 1, 2004

(54) IMAGING APPARATUS HAVING VIDEO MEMORY FUNCTION

(75) Inventors: Masaki Kobayashi, Kanagawa (JP); Makoto Sube, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 301 days.

(21) Appl. No.: 09/589,240

(22) Filed: Jun. 7, 2000

(30) Foreign Application Priority Data

Jun. 15, 1999 (JP) .......................................... 11-168692

(51) Int. Cl.[7] ............................................. H04N 5/907
(52) U.S. Cl. ....................... 348/715; 348/714; 348/718; 348/231.1; 348/231.99; 345/574; 345/545
(58) Field of Search ................................. 348/714, 715, 348/718, 561, 620, 231, 562, 719, 229.1, 230.1, 231.1, 231.99, 231.6, 231.9; 345/531, 533, 545, 554, 572, 574

(56) References Cited

U.S. PATENT DOCUMENTS

| 4,240,101 A | * | 12/1980 | Michael et al. ............. 348/444 |
| 4,864,402 A | * | 9/1989 | Ebihara et al. ............. 348/670 |
| 5,019,908 A | * | 5/1991 | Su .............................. 348/559 |
| 5,345,264 A | * | 9/1994 | Murata et al. ........... 348/208.12 |
| 5,459,510 A | * | 10/1995 | Hamalainen ................ 348/317 |
| 5,798,792 A | * | 8/1998 | Kusaka et al. ............ 348/222.1 |
| 5,917,546 A | * | 6/1999 | Fukui ......................... 348/296 |
| 5,940,146 A | * | 8/1999 | Sakaguchi et al. .......... 348/561 |
| 5,941,774 A | * | 8/1999 | Takemoto et al. ...... 273/121 B |
| 5,969,773 A | * | 10/1999 | Im .............................. 348/714 |
| 6,008,854 A | * | 12/1999 | Shimizu ..................... 348/445 |
| 6,195,131 B1 | * | 2/2001 | Kaneko ...................... 348/561 |
| 6,356,317 B1 | * | 3/2002 | Watabe et al. ........... 348/395.1 |

FOREIGN PATENT DOCUMENTS

| EP | 0 740 464 A1 | 10/1996 |
| JP | 6-46317 | 2/1994 |
| JP | 8-307760 | 11/1994 |

* cited by examiner

Primary Examiner—Michael H. Lee
Assistant Examiner—Leon W. Désir
(74) Attorney, Agent, or Firm—Pearne & Gordon LLP

(57) ABSTRACT

Imaging apparatus having a video memory function includes a video memory having a plurality of read ports and a capacity of storing images in two fields or more, wherein CCD storage sensitivity enhancement means is connected to a write port; a write control circuit for storing a single-field image in each memory area provided by dividing the storage space of the video memory into a plurality of sub-spaces; a plurality of read control sections for reading a single-field image stored in each memory area; and memory control means for reading an image from the video memory by a delay amount corresponding to the timing of a synchronization signal from the CCD storage sensitivity enhancement means. This configuration allows adjustment of the delay amount and prevents an image write address from passing by an image read address so that image data given CCD storage sensitivity enhancement is processed normally.

9 Claims, 12 Drawing Sheets

FIG. 2

| FIELD | A | B | A | B | A | B | A | B | A | B | A | B |
|---|---|---|---|---|---|---|---|---|---|---|---|---|
| VIDEO INPUT (201) | n-2 | n-1 | n | n+1 | n+2 | n+3 | n+4 | n+5 | n+6 | n+7 | n+8 | n+9 |

| FIELD | B | A | B | A | B | A | B | A | B | A | B | A |
|---|---|---|---|---|---|---|---|---|---|---|---|---|
| CYCLIC OUTPUT (206) | n-4 | n-3 | n-2 | n-1 | n | n+1 | n+2 | n+3 | n+4 | n+5 | n+6 | n+7 |

| FIELD | A | B | A | B | A | B | A | B | A | B | A | B |
|---|---|---|---|---|---|---|---|---|---|---|---|---|
| SENSITIVITY ENHANCED OUTPUT (207) | n-3 | n-2 | n-1 | n | n+1 | n+2 | n+3 | n+4 | n+5 | n+6 | n+7 | n+8 |

IMAGING APPARATUS HAVING VIDEO MEMORY FUNCTION

BACKGROUND OF THE INVENTION

The present invention relates to imaging apparatus having a video memory function, and more particularly, to imaging apparatus having a video memory function wherein a CCD storage sensitivity enhancement function and an electronic enlargement function are combined.

In conventional video signal processing apparatus, a part or all of a screen image is stored in memory and features including noise reduction and special effects are realized by controlling signals in the memory. Video signal processing apparatus which uses memory is devised so that various features are realized with relatively small amount of memory in order to support requests for compact size, low power consumption, and low cost. To realize a plurality of features with small amount of memory, there is proposed a method used for example in imaging apparatus having a video memory function such as that disclosed in JP-A-8-307760.

Conventional imaging apparatus is described below with reference to FIG. 12. In FIG. 12, a signal input to a video input 101 is written via a write port of a field memory 102 via control of a write control circuit 103. The signal written to the field memory 102 is delayed by a single field, read from a first read port of the field memory 102 via control of a first read control circuit 104, and read from a second read port of the field memory via control of a second read control circuit 105. The first read control circuit 104 performs control to read a signal in an area from an address given by a read start relative address 107 to an address given by a read end relative address 108. The signal read from the first port of the field memory 102 is output from a video output 106 and electronically enlarged by an interpolation circuit (not shown). A second read control circuit 105 reads the signal in the entire signal write area. A signal read from the second port of the field memory 102 is used as a noise reduction signal 109 by a cyclic noise reduction circuit (not shown). The write control circuit 103 performs control to start writing from the address next to the address given by a read end relative address 108. By using the field memory 102 in the form of a ring, a write address does not pass by a first read address. The above operation is synchronized by a synchronization signal 110.

In this way, a plurality of features such as the electronic enlargement feature and cyclic noise reduction feature can be realized simultaneously by controlling a field memory in the form of a ring via use of a three-port field memory having one write port and two read ports.

In conventional video signal processing apparatus stated above, however, a combination of the CCD storage sensitivity enhancement feature, the cyclic noise reduction feature and the electronic enlargement feature presents a problem: a write address passes by a read address and an image is read with the order of write times inverted. This prevents a normal video signal from being obtained. Such an image is acceptable as a still picture but unacceptable as an animated image.

SUMMARY OF THE INVENTION

The invention solves such a problem. The invention aims at reading a normal video signal by prevention a write address from passing by a read address even in a case where a combination of the CCD storage sensitivity enhancement feature, the cyclic noise reduction feature and the electronic enlargement feature is used, by using a three-port field memory having one write port and two read ports.

In order to solve such a problem, according to the invention, imaging apparatus having a video memory function comprises: a video memory having a plurality of read ports and a capacity of storing images in two fields or more, wherein CCD storage sensitivity enhancement means is connected to a write port; a write control circuit for storing a single-field image in each memory area provided by dividing the storage space of the video memory into a plurality of sub-spaces; a plurality of read control sections for reading a single-field image stored in each memory area; and memory control means for reading an image from the video memory by a delay amount corresponding to the timing of a synchronization signal from the CCD storage sensitivity enhancement means. This configuration allows adjustment of the delay amount and prevents an image write address from passing by an image read address so that image data given CCD storage sensitivity enhancement is processed normally.

Also provided is electronic enlargement means connected to the read ports. This configuration prevents an image write address from passing by an image read address thus enabling a normal electronic enlargement processing.

Also provided is vertical inversion read means connected to the read ports. This configuration prevents an image write address from passing by an image read address thus enabling a normal vertical inversion processing.

Also provided is noise reduction means connected to the read ports. This configuration prevents an image write address from passing by an image read address thus enabling a normal noise reduction processing.

Also provided are means for automatically determining an input image field based on a horizontal synchronization signal and a vertical synchronization signal and means for setting a memory area where image data is to be written depending on a sensitivity enhancement control signal from a CPU. This configuration allows an image given CCD storage sensitivity enhancement to be written to a memory area where the order of write times is observed.

Also provided is a circuit for generating a vertical color order identification signal corresponding to a read field and a read address according to an electronic enlargement control signal and a CCD storage sensitivity enhancement mode control signal, wherein the vertical color order identification signal can be reset to an initial value for each field via the CPU. This configuration allows generation of a proper vertical color order identification signal and proper enlargement of an image given CCD storage sensitivity enhancement.

The first aspect of the invention is imaging apparatus having a video memory function comprising: a video memory having a plurality of read ports and a capacity of storing images in two fields or more, wherein CCD storage sensitivity enhancement means is connected to a write port; a write control circuit for storing a single-field image in each memory area provided by dividing the storage space of the image memory into a plurality of sub-spaces; a plurality of read control sections for reading a single-field image stored in each memory area; and memory control means for reading an image from the image memory by a delay amount corresponding to the timing of a synchronization signal from the CCD storage sensitivity enhancement means. This aspect has an effect of reading images given CCD sensitivity enhancement in proper time order.

The second aspect of the invention is imaging apparatus according to the first aspect of the invention, equipped with electronic enlargement means connected to the read ports. This aspect has an effect of performing enlargement without disturbing the time order.

The third aspect of the invention is imaging apparatus according to the first aspect of the invention, equipped with vertical inversion read means connected to the read ports. This aspect has an effect of performing vertical inversion without disturbing the time order.

The fourth aspect of the invention is imaging apparatus according to the first aspect of the invention, equipped with noise reduction means connected to the read ports. This aspect has an effect of performing noise reduction without disturbing the time order.

The fifth aspect of the invention is imaging apparatus according to any one of the first aspect through the fourth aspect, equipped with means for automatically determining an input image field based on a horizontal synchronization signal and a vertical synchronization signal and means for setting a memory area where image data is to be written depending on a sensitivity enhancement control signal from a CPU. This aspect has an effect of obtaining and setting a proper memory area where image data is to be written from a horizontal synchronization signal and a vertical synchronization signal.

The sixth aspect of the invention is imaging apparatus according to the fifth aspect, equipped with a circuit for generating a vertical color order identification signal corresponding to a read field and a read address according to an electronic enlargement control signal and a CCD storage sensitivity enhancement mode control signal, wherein the vertical color order identification signal can be reset to an initial value for each field via the CPU. This aspect has an effect of generating a proper vertical color order identification signal.

BRIEF DESCRIPTION OF THE DRAWINGS

FIG. 2 shows video signals in the normal mode for imaging apparatus having a video memory function according to the first embodiment of the invention;

DETAILED DESCRIPTION OF THE PREFERRED EMBODIMENTS

Embodiments of the invention are described in detail with reference to FIGS. 1 through 11.

First Embodiment

A first embodiment of the invention is imaging apparatus having a video memory function which stores two-field image data given CCD storage enhancement in a three-port memory, reads the data with an appropriate delay, then performs electronic enlargement, vertical inversion and noise reduction.

Figure 1:
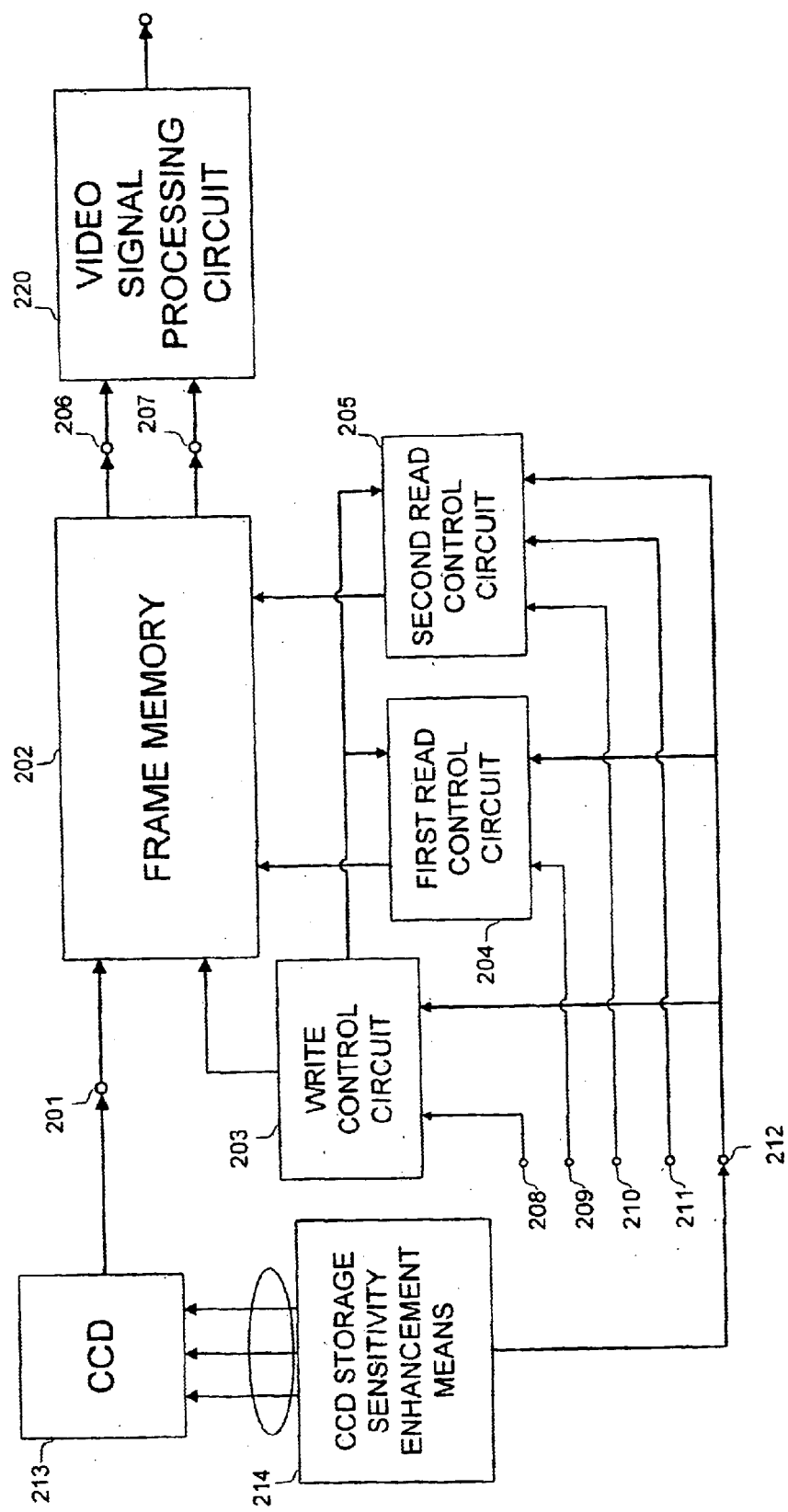
FIG. 1 is a block diagram showing a configuration of imaging apparatus having a video memory function according to the first embodiment of the invention.

FIG. 1 is a functional block diagram of imaging apparatus having a video memory function according to the first embodiment of the invention. In FIG. 1, an input terminal or write port 201 is a terminal for inputting a video input signal. A frame memory 202 is a three-port memory having a capacity of storing images in two fields or more. A write control circuit 203 is a circuit for controlling data read from a first read port of the frame memory 202. A first read control circuit 204 is a circuit for controlling data read from a first read port of the frame memory 202. A second read control circuit 205 is a circuit for controlling data read from a second read port of the frame memory 202. An output terminal or read port 206 is a terminal for outputting a video output signal read from the frame memory 202 according to control of the first read control circuit 204. An output terminal or read port 207 is a terminal for outputting a video output signal read from the frame memory 202 according to control of the second read control circuit 205. A write area control terminal 208 is a terminal for controlling to which area of the frame memory 202 the write control circuit 203 will write an image. A first read area control terminal 209 is a terminal for controlling from which area of the frame memory 202 the first read control circuit 204 will read an image. A second read area control terminal 210 is a terminal for controlling from which area of the frame memory 202 the second read control circuit 205 will read an image. A read address setting terminal 211 is a terminal for determining from which address the second read control circuit 205 will read an image stored in the frame memory 202. A synchronization signal input terminal 212 is a terminal for inputting a synchronization signal. The write control circuit 203, the first read control circuit 204 and the second read control circuit 205 operate, according to the synchronization signal, in synchronization with a video signal input to the input terminal 201 and a video signal processing circuit 220 connected externally to the output terminals 206 and 207. A CCD storage sensitivity enhancement means 214 is connected to the input terminal 201 of the frame memory 202 through a CCD 213 to provide the video signal. The video signal processing circuit 220 comprises one or more of an electronic enlargement means, a vertical inversion read means, and a noise reduction means.

Operation of the imaging apparatus having a video memory function according to the first embodiment of the invention configured as mentioned earlier is described with reference to FIG. 1. A video input to the input terminal 201 is written to an area of the frame memory 202 specified by the write area control terminal 208, by using the write address of the frame memory 202 and a write control signal generated by the write control circuit synchronized by the synchronization signal input to the synchronization signal input terminal 212.

The first read control circuit 204 is synchronized by the synchronization signal input to the synchronization signal input terminal 212, generates a first read address of the frame memory 202 and a first read control signal, reads an image from an area of the frame memory 202 specified by the first read area control terminal 209, then outputs the image from the output terminal 206.

The second read control circuit 205 is synchronized by the synchronization signal input to the synchronization signal input terminal 212, generates a second read address of the frame memory 202 and a second read control signal, reads an image from an area of the frame memory 202 specified by the second read area control terminal 210, then outputs the image from the output terminal 207.

The input/output terminal of a video signal in the normal mode is described with reference to FIG. 2. FIG. 2 shows the relationship between a video signal input to the input terminal 201, a video signal output from the output terminal 206, 207, and fields in each signal. The relationship shown in FIG. 2 is a relationship in the normal mode. In FIG. 2, fields indicate each field for each video signal. A video signal input to the input terminal 201 is indicated as a video input. A video signal output from the output terminal 206 is indicated as a cyclic output. A video signal output from the output terminal 207 is indicated as a sensitivity enhancement output. The cyclic output signal is output with one frame delay after the video input. The sensitivity enhancement signal is output with one field delay after the video input.

Figure 3:
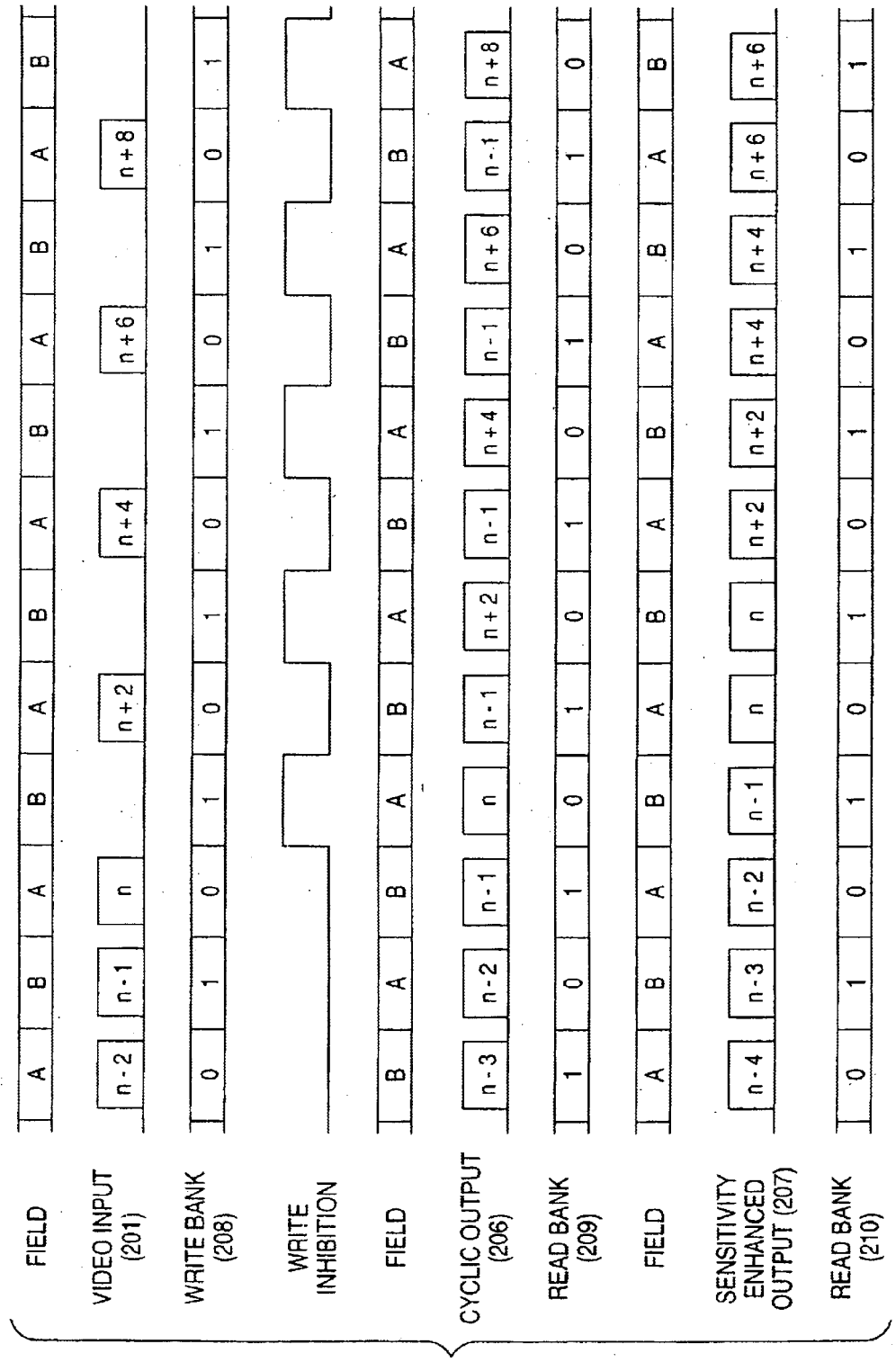
FIG. 3 shows video signals obtained when sensitivity doubling feature in the related art is applied to imaging apparatus having a video memory function according to the first embodiment of the invention, with data write to Field B inhibited.

For comparison, the relationship between a video signal input to the input terminal 201, a video signal output from the output terminal 206, 207, and fields in each signal assumed when processing is made by a conventional scheme in the CCD storage sensitivity doubling mode, is described with reference to FIG. 3. In FIG. 3, a video signal input to the input terminal 201 is indicated as a video input. A video signal output from the output terminal 206 is indicated as a cyclic output. A video signal output from the output terminal 207 is indicated as a sensitivity enhancement output. Here, in the frame memory 202, the area for storing images in Field A is indicated as Bank 0, and the area for storing images in Field B is indicated as Bank 1, which is indicated as a write bank in FIG. 3. In a conventional scheme, a write bank signal is input alternately as 0, 1, 0, 1, 0, ... from the write area control terminal 208, input alternately as 0, 1, 0, 1, 0, ... from the first read area control terminal 209, and input alternately as 0, 1, 0, 1, 0, ... from the second read area control terminal 210.

In FIG. 3, the system enters the CCD storage sensitivity doubling operation in the fourth field. In this operation, an image from Field B is inhibited and CCD charge storage is doubled for an image in Field A. That is, input of images (n+1), (n+3), (n+5), (n+7), and (n+8) is inhibited. The write control circuit 203 inhibits data write to the frame memory 202 during a period when no images are input. In the CCD storage sensitivity doubling mode, images in Bank 0 are updated but images in Bank 1 are not. As a result, images in Field A of a cyclic output are sequentially updated while images in Field B of the output remains as they were before the CCD storage sensitivity doubling mode started. Similarly, images in Field A of a sensitivity enhancement output are sequentially updated while images in Field B of the output remains as they were before the CCD storage sensitivity doubling mode started.

Figure 4:
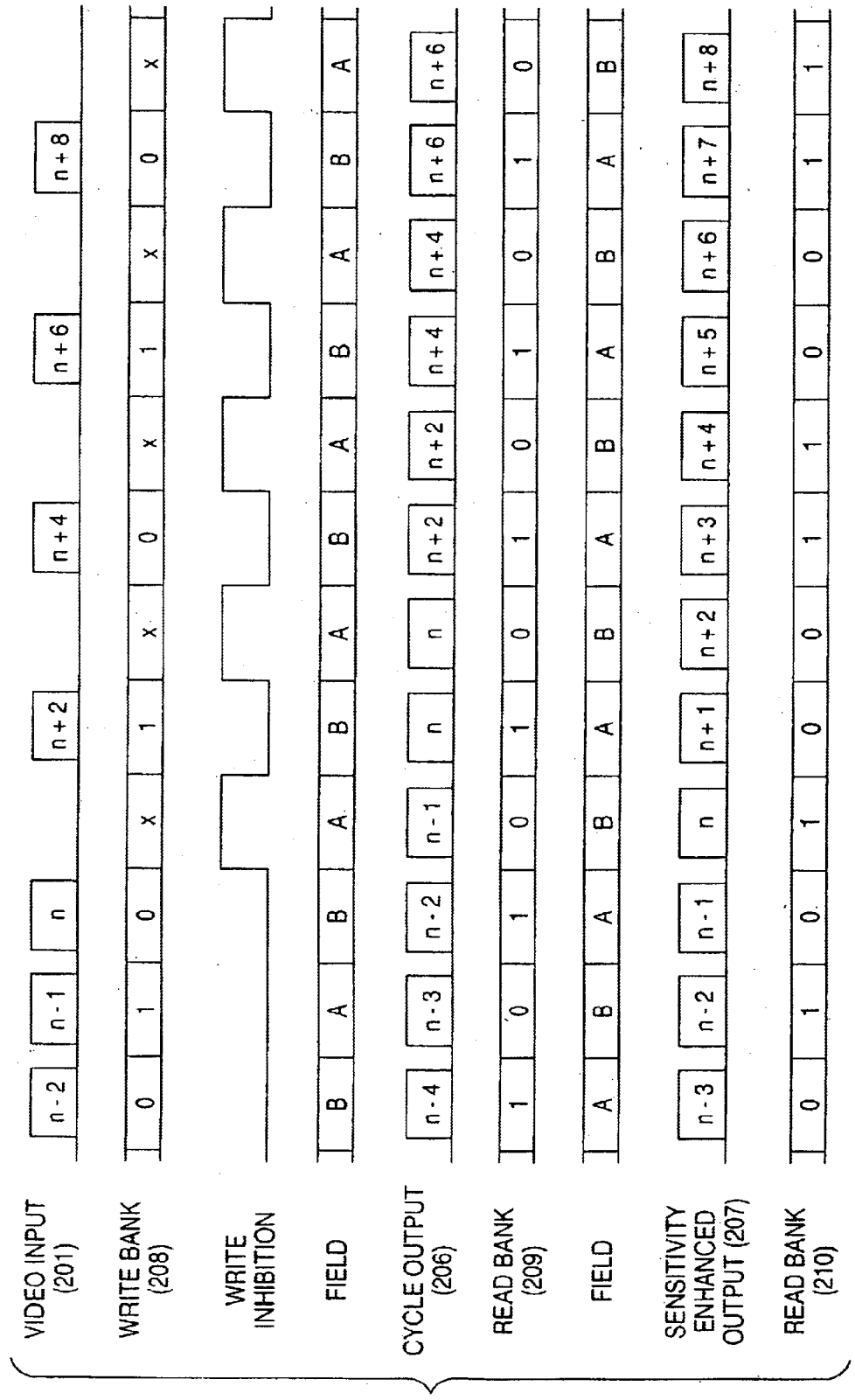
FIG. 4 shows video signals obtained in a sensitivity doubling mode for imaging apparatus having a video memory function according to the first embodiment of the invention, with data write to Field B inhibited.

In the third place, the relationship between a video signal input to the input terminal 201, a video signal output from the output terminal 206, 207, and fields in each signal in the CCD storage sensitivity doubling mode according to the first embodiment of the invention, is described with reference to FIG. 4. In FIG. 4, a video signal input to the input terminal 201 is indicated as a video input. A video signal output from the output terminal 206 is indicated as a cyclic output. A video signal output from the output terminal 207 is indicated as a sensitivity enhancement output. Here, in the frame memory 202, the area for storing images in Field A is indicated as Bank 0, and the area for storing images in Field B is indicated as Bank 1, which is indicated as a write bank in FIG. 4.

In this case, a write bank is inverted from the write area control terminal 208 each time a video input is received. A control signal is input to the first read area control terminal 209 so that the newest image of all the images written before one frame stored in the frame memory is read. Also, a control signal is input to the second read area control terminal 210 so that the newest image of all the images written before one frame stored in the frame memory is read.

In the CCD storage sensitivity doubling mode, bank are switched from field to field and images are stored in a period when images are input. When the signal at the first read area control terminal 209 is controlled as shown in FIG. 4, the newest image in both Field A and Field B can be output as cyclic output. Note that, because the same image is output for Field A and Field B, a shift of 0.5 lines must be corrected. Similarly, when the signal at the second read area control terminal 210 is controlled as shown in FIG. 4, the newest image in both Field A and Field B can be output as cyclic output. Note that, because the same image is output for Field A and Field B, a shift in 0.5 lines must be corrected. In this way, normal data read in the CCD storage sensitivity doubling mode is realized.

Figure 5:
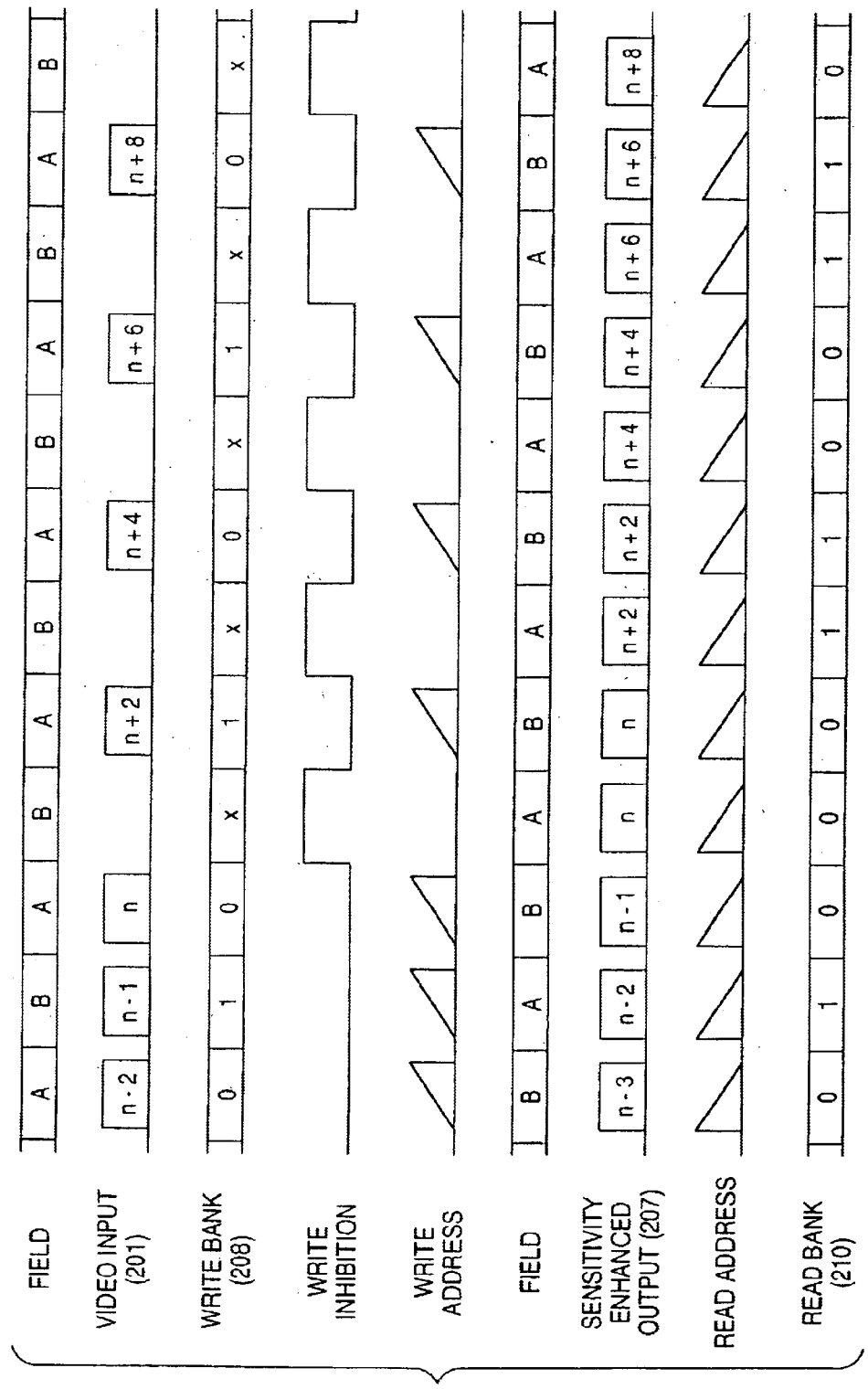
FIG. 5 shows addresses obtained in the sensitivity doubling mode for imaging apparatus having a video memory function according to the first embodiment of the invention, with write bank control disabled in vertical inversion read.

In the fourth place, addresses in the frame memory 202 in vertical inversion read processing in the CCD storage sensitivity doubling mode are described with reference to FIG. 5. In FIG. 5, a video signal input to the input terminal 201 is indicated as a video input. A video signal output from the output terminal 206 is omitted in FIG. 5. A video signal output from the output terminal 207 is indicated as a sensitivity enhancement output. Here, in the frame memory 202, the area for storing images in Field A is indicated as Bank 0, and the area for storing images in Field B is indicated as Bank 1, which is indicated as a write bank in FIG. 5. In this case, a write bank is inverted from the write area control terminal 208 each time a video input is received.

A control signal is input to the first read area control terminal 209 so that the newest image of all the images written before one frame stored in the frame memory is read. Also, a control signal is input to the second read area control terminal 210 so that the newest image of all the images written before one frame stored in the frame memory is read.

In FIG. 5, the system enters the CCD storage sensitivity doubling operation in the fourth field. In this operation, input of images from Field B is inhibited and CCD charge storage is doubled for an image in Field A. That is, input of images (n+1), (n+3), (n+5), (n+7), and (n+8) is inhibited. The write control circuit 203 inhibits data write to the frame memory 202 during a period when no images are input. In FIG. 5, a write address in the frame memory generated by the write control circuit 203 is indicated as a write address which increases monotonically.

A read address in the frame memory generated by the second read control circuit 205 is indicated as a read address. The read address decreases monotonically in the case of vertical inversion read processing. In a conventional scheme, read processing and write processing occur simultaneously and the write address which is monotonically increasing and the read address which is decreasing monotonically match at the center of the address area.

In happened that image data read around the address matching point was written at different times, thus generating an unacceptable image. In the first embodiment of the invention, a signal at the write area control terminal 208, a signal at the first read area control terminal 209 and a signal at the second read area control terminal 210 are used in order that a write bank and read bank for the frame memory always differ from each other. Accordingly, the newest image can be output from among sensitivity enhancement output signals in vertical inversion read processing. This prevents an unacceptable image due to inversion of a write address and a read address.

Figure 6:
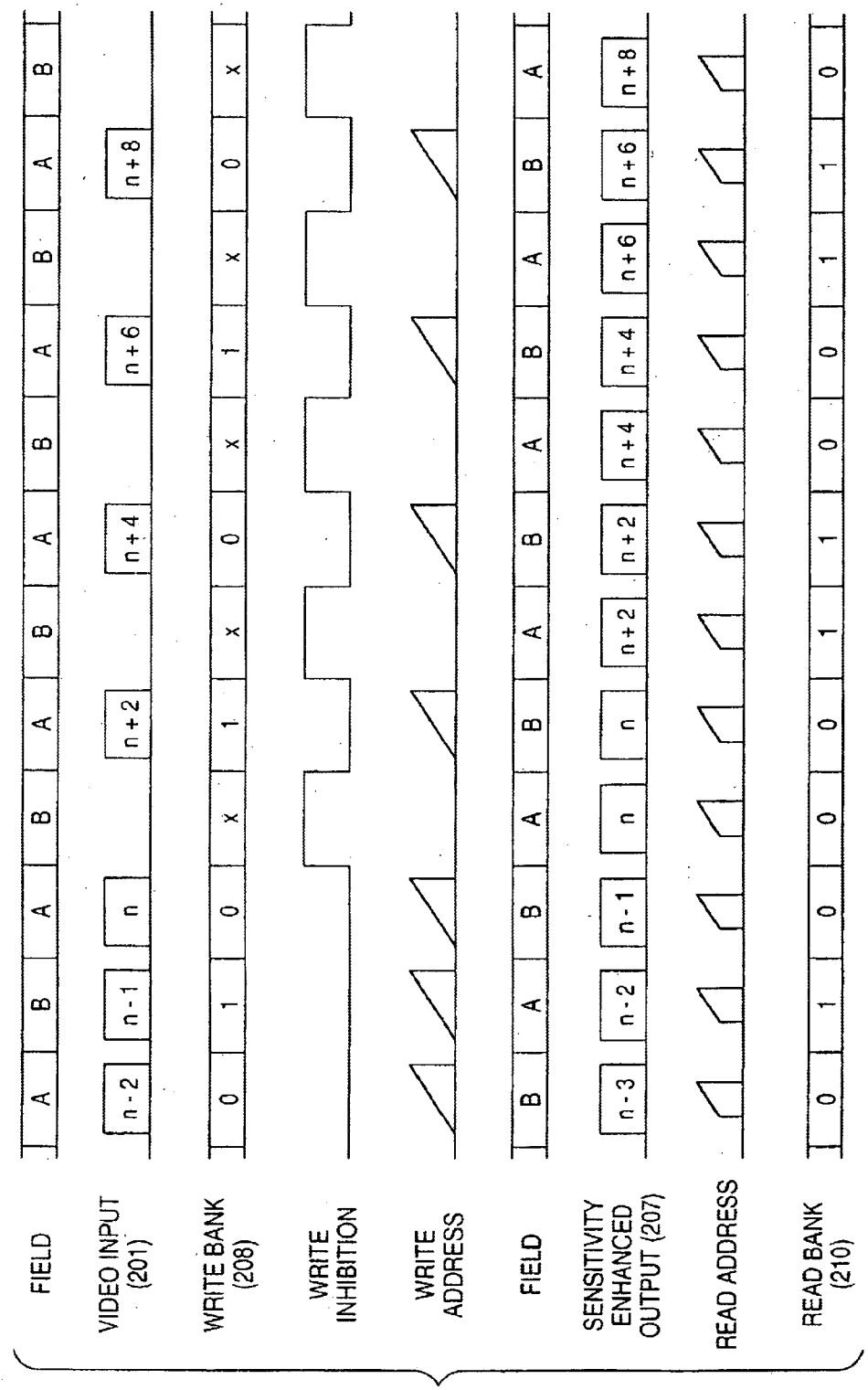
FIG. 6 shows addresses obtained in the sensitivity doubling mode for imaging apparatus having a video memory function according to the first embodiment of the invention, with write bank control disabled in electronic enlargement.

In the fifth place, addresses in the frame memory 202 in electronic enlargement in the CCD storage sensitivity doubling mode are described with reference to FIG. 6. In FIG. 6, a video signal input to the input terminal 201 is indicated as a video input. A video signal output from the output terminal 206 is omitted in FIG. 6. A video signal output from the output terminal 207 is indicated as a sensitivity enhancement output. Here, in the frame memory 202, the area for storing images in Field A is indicated as Bank 0, and the area for storing images in Field B is indicated as Bank 1, which is indicated as a write bank in FIG. 6. In this case, a write bank is inverted from the write area control terminal 208 each time a video input is received. A control signal is input to the first read area control terminal 209 so that the newest image of all the images written before one frame stored in the frame memory is read. Also, a control signal is input to the second read area control terminal 210 so that the newest image of all the images written before one frame stored in the frame memory is read. In FIG. 6, the system enters the CCD storage sensitivity doubling operation in the fourth field.

In this operation, an image from Field B is inhibited and CCD charge storage is doubled for an image in Field A. That is, input of images (n+1), (n+3), (n+5), (n+7), and (n+8) is inhibited. The write control circuit 203 inhibits data write to the frame memory 202 during a period when no images are input. In FIG. 6, a write address in the frame memory generated by the write control circuit 203 is indicated as a write address which increases monotonically.

A read address in the frame memory generated by the second read control circuit 205 is indicated as a read address. The read address starts from any address and increases monotonically. In a conventional scheme, read processing and write processing occur simultaneously and the read address which is monotonically increasing from any address may pass by the write address increasing monotonically from zero (0). In happened that image data read around the address matching point was written at different times, thus generating an unacceptable image. In the first embodiment of the invention, a signal at the write area control terminal 208, a signal at the first read area control terminal 209 and a signal at the second read area control terminal 210 are used in order that a write bank and read bank for the frame memory always differ from each other. Accordingly, a read address never passes by a read address in electronic enlargement. The newest image is always output from among the sensitivity enhancement output signals. This prevents an unacceptable image from being generated.

As stated earlier, in the first embodiment of the invention, imaging apparatus having a video memory function has a configuration wherein two-field image data given CCD storage enhancement is stored in a three-port memory, and the data is read with any delay for electronic enlargement, vertical inversion and noise reduction. This allows more than one type of image processing to be made in proper time order.

Second Embodiment

A second embodiment of the invention is imaging apparatus having a video memory function which automatically determines an input image field based on a horizontal synchronization signal and a vertical synchronization signal and sets a memory area where image data is to be written depending on a sensitivity enhancement control signal from a CPU.

Figure 7:
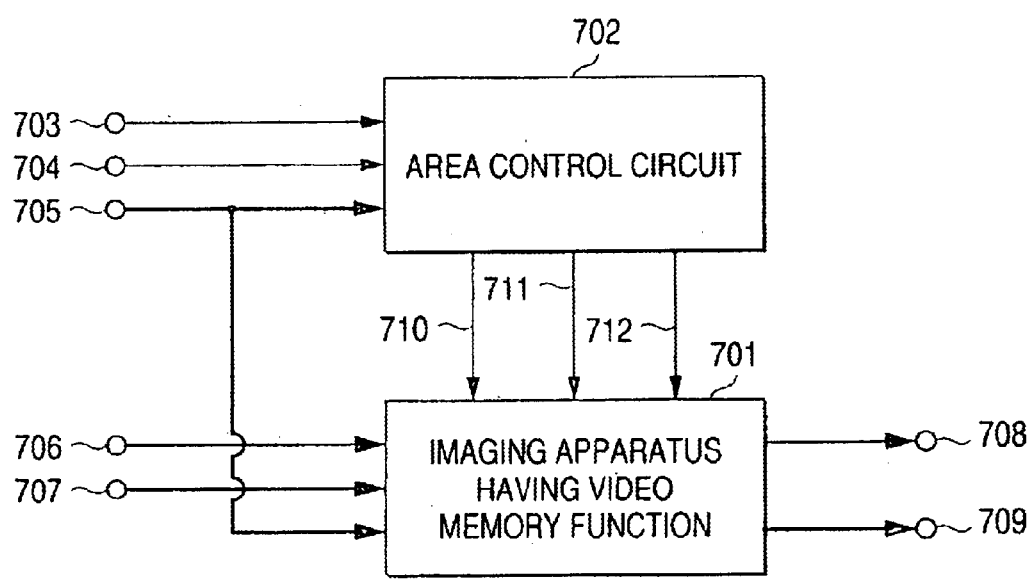
FIG. 7 is a block diagram showing a configuration of imaging apparatus according to the second embodiment of the invention.

FIG. 7 is a functional block diagram of imaging apparatus having a video memory function according to the second embodiment of the invention. In FIG. 7, imaging apparatus having a video memory function 701 is apparatus shown in the first embodiment.

An area control circuit 702 is a circuit which automatically generates each of area control signals used to control the write control circuit 203, the first read control circuit 204 and the second read control circuit 205. An input terminal 703 is a terminal for inputting the horizontal synchronization signal.

An input terminal 704 is a terminal for inputting the vertical synchronization signal. An input terminal 705 is a terminal for inputting the CCD storage sensitivity enhancement control signal from the CPU. An input terminal 706 is a terminal for inputting the video input signal. A read address setting terminal 707 is a terminal for inputting a signal for determining from which address the second read control circuit 205 should read the image stored in the frame memory 202. An output terminal 708 is a terminal for outputting a video output signal read from the frame memory 202 according to the control of the first read control circuit 204. An output terminal 709 is a terminal for outputting a video output signal read from the frame memory 202 according to the control of the second read control circuit 205. A first area control signal 710 is a signal generated by the area control circuit 702 to control the write control circuit 203. A second area control signal 711 is a signal generated by the area control circuit 702 to control the first read control circuit 204. A third area control signal 712 is a signal generated by the area control circuit 702 to control the second read control circuit 205.

Operation of the imaging apparatus having a video memory function according to the second embodiment of the invention configured as mentioned earlier is described with reference to FIG. 7. A video signal input to the input terminal 706 is input always in synchronization with the horizontal synchronization signal input to the input terminal 703 and the vertical synchronization signal input to the input terminal 704. A CCD storage sensitivity enhancement control signal reports to the area control circuit 702 whether the video signal input to the input terminal 706 is a normal video signal or a video signal in the CCD storage sensitivity enhancement mode. In response to this report, the area control circuit 702 provides the imaging apparatus having a video memory function 701 with the first area control signal 710, the second area control signal 711, and the third area control signal 712. The imaging apparatus having a video memory function according to the second embodiment of the invention can thus automatically determine the bank used for storing image data in the frame memory 202, only via a CCD storage sensitivity control signal.

Figure 8:
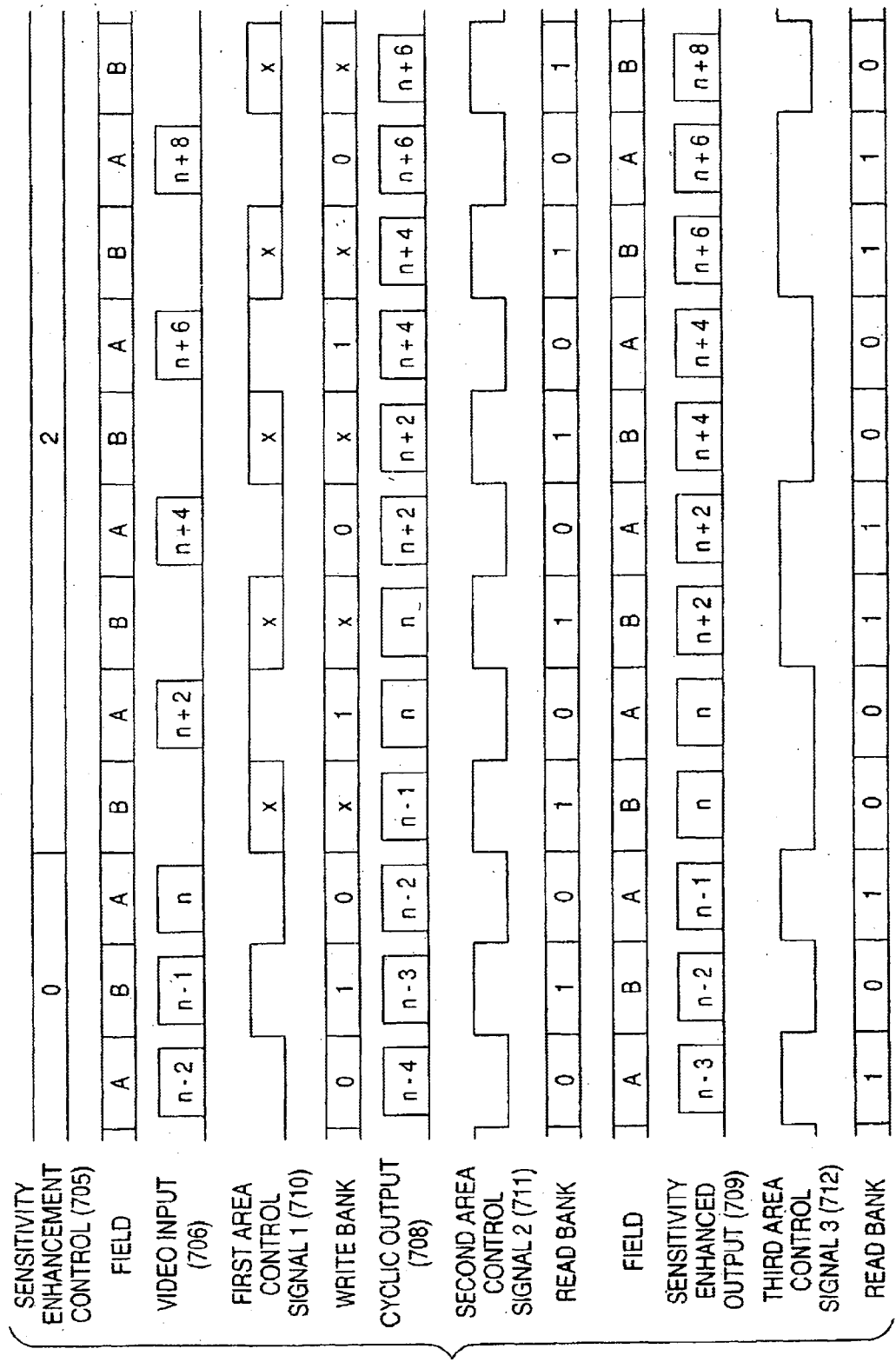
FIG. 8 shows a relationship between video signals and bank control in the sensitivity doubling mode for imaging apparatus according to the second embodiment of the invention.

Next, the timing of the imaging apparatus having a video memory function according to the second embodiment of the invention is described with reference to FIG. 8. In FIG. 8, a video signal input to the input terminal 706 is indicated as a video input. A CCD storage sensitivity enhancement control signal input to the input terminal 705 is indicated as a sensitivity enhancement control. The first area control signal is indicated as the area control signal 1. The second area control signal is indicated as the area control signal 2. The third area control signal is indicated as the area control signal 3. A video signal output from the output terminal 708 is indicated as a cyclic output. A video signal output from the output terminal 709 is indicated as a sensitivity enhancement output.

In case the area control signal 1 is '0', the write control circuit 203 writes an image to Bank 0 of the frame memory 202, and in case the area control signal 1 is '1', to Bank 1. In case the sensitivity enhancement control is set to 0 (normal mode), control is made so that the area control signal 1 is '0' when images are input from Field A, and '0' when images are input from Field B. In case the sensitivity enhancement control is set to 2, input of images from Field B is inhibited and only images from Field A are input. Thus, the area control signal 1 is generated so that banks are sequentially switched from field to field containing video signals to be input.

In case the area control signal 2 is '0', the write control circuit 203 writes an image to Bank 0 of the frame memory 202, and in case the area control signal 1 is '1', to Bank 1. In case the sensitivity enhancement control is set to 0 (normal mode), control is made so that the area control signal 1 is '0' when images are input from Field A, and '0' when images are input from Field B. In case the sensitivity enhancement control is set to 2, images in either bank of the frame memory 202 is updated once in two fields.

Thus, the area control signal 2 is generated so that banks are sequentially switched to read images in the frame memory 202 while keeping an cyclic output delayed at least one frame from a video input.

In case the area control signal 3 is '0', the write control circuit 203 writes an image to Bank 0 of the frame memory 202, and in case the area control signal 1 is '1', to Bank 1. In case the sensitivity enhancement control is set to 0 (normal mode), control is made so that the area control signal 1 is '0' when images are input from Field A, and '0' when images are input from Field B. In case the sensitivity enhancement control is set to 2, images in either bank of the frame memory 202 is updated once in two fields.

Thus, the area control signal 2 is generated so that banks are sequentially switched to read images in the frame memory 202 while keeping a sensitivity enhancement output delayed at least one field from a video input.

As stated earlier, in the second embodiment of the invention, imaging apparatus having a video memory function is configured to automatically determine an input image field based on a horizontal synchronization signal and a vertical synchronization signal and to set a memory area where image data is to be written depending on a sensitivity enhancement control signal from a CPU. This allows the bank used for storing image data in the frame memory 202 to be determined, only via a CCD storage sensitivity control signal.

Third Embodiment

A third embodiment of the invention is imaging apparatus which generates a vertical color order identification signal corresponding to a read field and a read address according to an electronic enlargement control signal and a CCD storage sensitivity enhancement mode control signal, wherein the vertical color order identification signal can be reset to an initial value for each field via the CPU.

Figure 9:
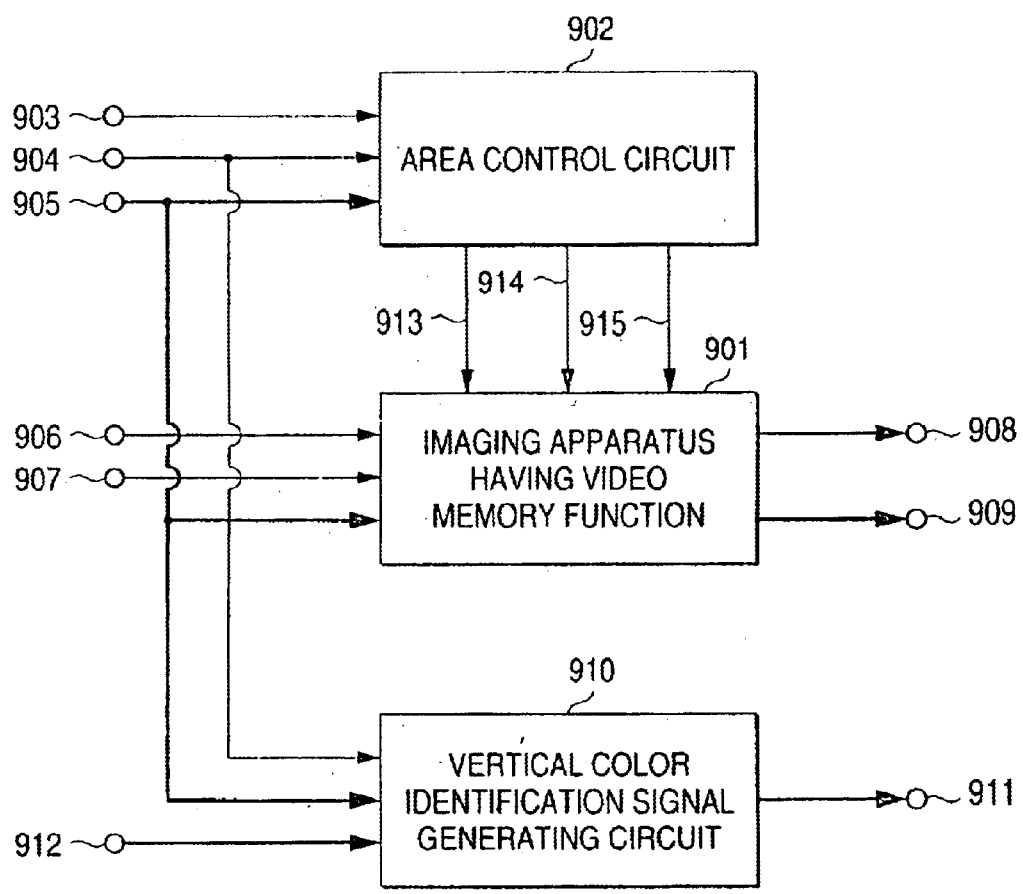
FIG. 9 is a block diagram showing a configuration of imaging apparatus according to the third embodiment of the invention.

FIG. 9 is a functional block diagram of imaging apparatus having a video memory function according to the third embodiment of the invention. In FIG. 9, imaging apparatus having a video memory function 901 is a circuit shown in the second embodiment.

An input terminal 903 is a terminal for inputting the horizontal synchronization signal. An input terminal 904 is a terminal for inputting the vertical synchronization signal. An input terminal 905 is a terminal for inputting the CCD storage sensitivity enhancement control signal from the CPU. An input terminal 906 is a terminal for inputting the video input signal.

A read address setting terminal 907 is a terminal for setting a read address for determining from which address the second read control circuit 205 should read the image stored in the frame memory 202. An output terminal 908 is a terminal for outputting a video output signal read from the frame memory 202 according to the control of the first read control circuit 204. An output terminal 909 is a terminal for outputting a video output signal read from the frame memory 202 according to the control of the second read control circuit 205. A vertical color identification signal generator circuit 910 is a vertical color identification signal generator circuit for automatically generating a vertical color identification signal by using the horizontal synchronization signal input to the input terminal 903, the vertical synchronization signal input to the input terminal 904, and the CCD storage sensitivity enhancement control signal input to the input terminal 905. An input terminal 912 is a terminal for inputting an initial value setting control signal for setting an initial value of the vertical color identification signal generated by the vertical color identification signal generator circuit 910. An output terminal 911 is a terminal for outputting a vertical color identification signal as an output signal from the vertical color identification signal generator circuit.

Operation of the imaging apparatus having a video memory function according to the third embodiment of the invention configured as mentioned earlier is described with reference to FIG. 9. As shown in the second embodiment, the area control circuit 902 specifies a write bank and a read bank of the frame memory 202 for the write control circuit 203, the first read control circuit 204 and the second read control circuit 205 of the imaging apparatus having a video memory function 901. The bank of the frame memory to which the write control circuit 203 wrote video data, that is, bank 0 or bank 1, and the corresponding field which retains such data, Field A or Field B, are stored in the register. In case the second read control circuit uses a read bank of the frame memory 202, the vertical color identification signal generator circuit 910 can automatically generate a vertical color identification signal.

Thus, the imaging apparatus having a video memory function according to the third embodiment of the invention can generate a vertical color identification signal corresponding to a video output signal only via a CCD storage sensitivity control signal from the CPU.

Figure 10:
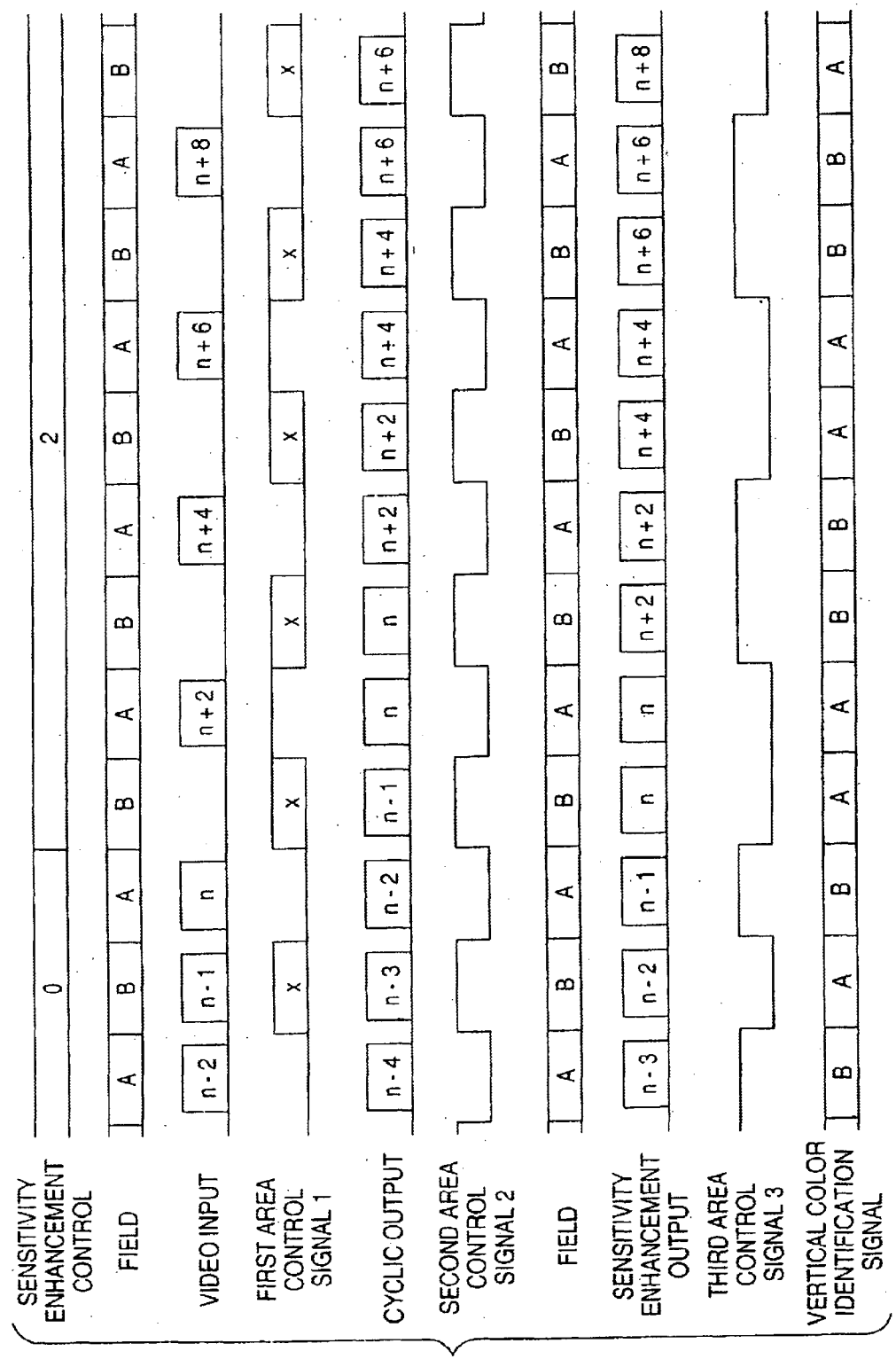
FIG. 10 shows a relationship between video signals and vertical color identification signals in the sensitivity doubling mode for imaging apparatus according to the third embodiment of the invention.

Next, the relationship between a video signal and a vertical color identification signal is described with reference to FIG. 10. In FIG. 10, a video signal input to the input terminal 906 is indicated as a video input. A CCD storage sensitivity enhancement control signal input to the input terminal 905 is indicated as a sensitivity enhancement control. The first area control signal is indicated as the area control signal 1. The second area control signal is indicated as the area control signal 2. The third area control signal is indicated as the area control signal 3. A video signal output from the output terminal 908 is indicated as a cyclic output. A video signal output from the output terminal 909 is indicated as a sensitivity enhancement output. A vertical color identification signal is shown at the bottom section.

A vertical color identification signal is a signal for identifying the layout of video signals per line in synchronization with a horizontal synchronization signal. The phase is identical between the signals in video input for Field A. The same is true for Field B. Thus, the vertical color identification signal generator circuit 910 can automatically generate a vertical color identification signal from a field of the video data read from the frame memory 202. Once a decision is made as to whether the read start line is even or odd before vertical inversion or electronic enlargement, a vertical color identification signal can be automatically generated.

Figure 11:
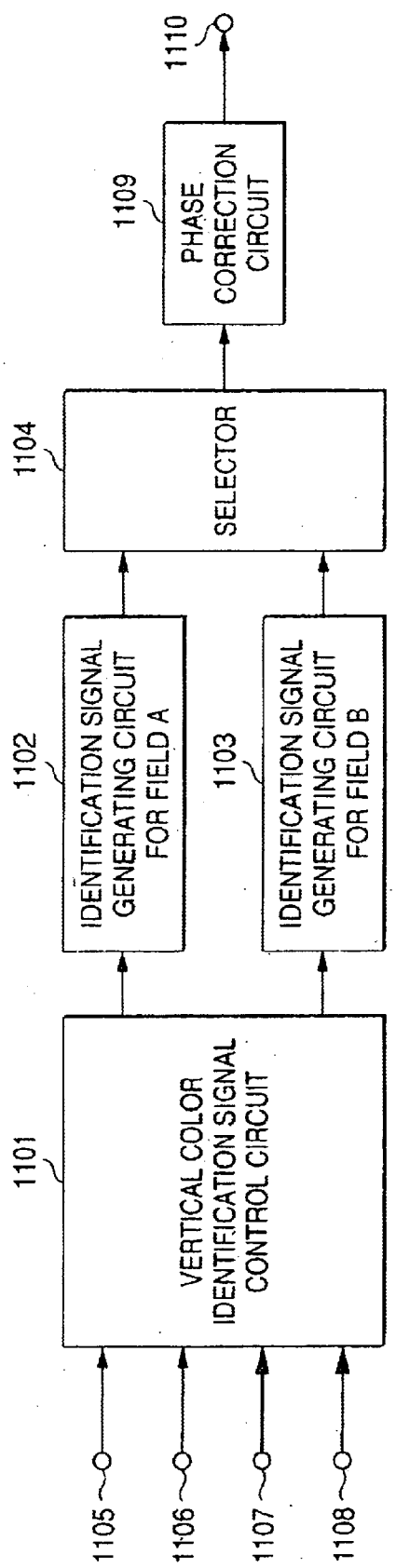
FIG. 11 is a block diagram showing a configuration of a vertical color identification signal generator circuit according to the third embodiment of the invention.
Figure 12:
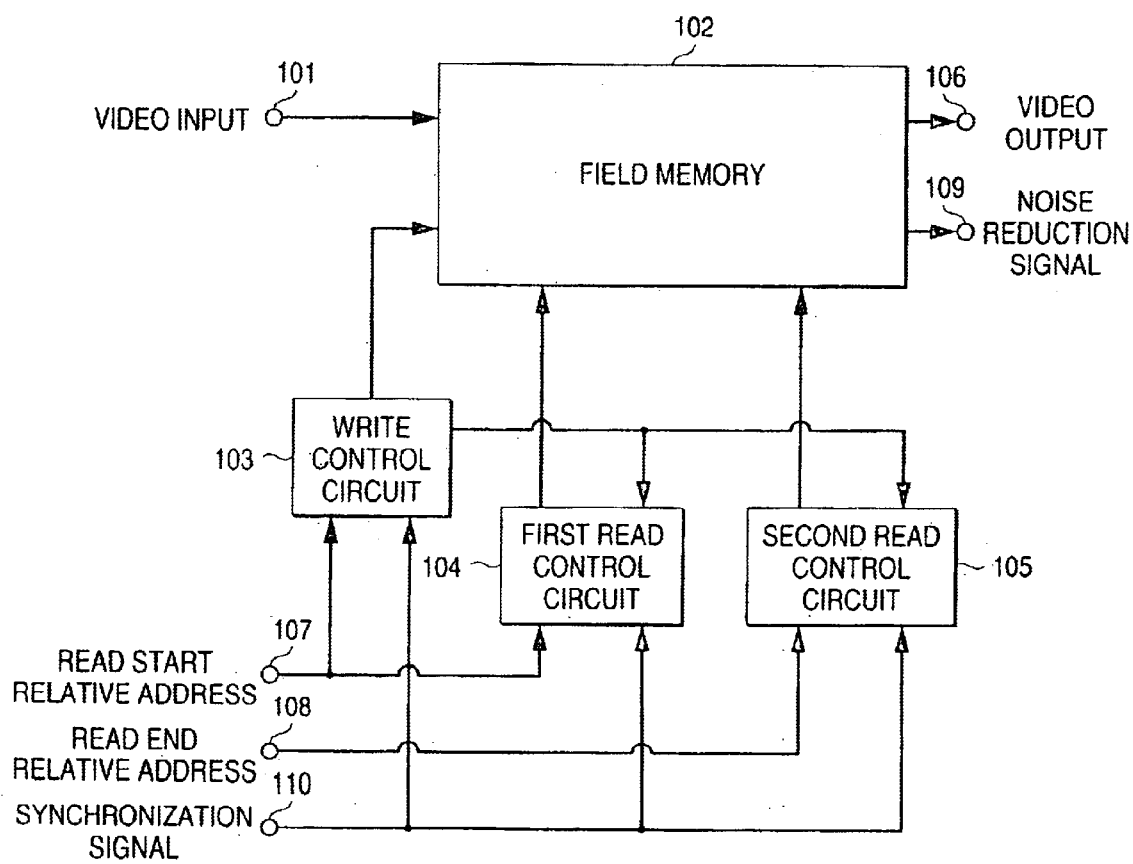
FIG. 12 is a block diagram showing a configuration of conventional imaging apparatus having a video memory function.

In the third place, configuration of the vertical color identification signal generator circuit 910 is described with reference to FIG. 11. Shown in FIG. 11 are: a vertical color identification signal control circuit 1101; an identification signal generator for Field A 1102; an identification signal generator for Field B 1103; a selector 1104 for switching between an output of the identification signal generator for Field A 1102 and an output of the identification signal generator for Field B 1103; an input terminal 1105 for inputting a vertical synchronization signal; an input terminal 1105 for inputting a vertical synchronization signal; an input terminal 1106 for inputting a horizontal synchronization signal; a CCD sensitivity enhancement signal from the CPU 1107; an initial value setting control signal 1108 for a vertical color identification signal for Field A and a vertical color identification signal for Field B; a phase correction circuit 1109 for applying phase correction in case the phase of a vertical color identification signal is to be adjusted via magnitude of sensitivity enhancement; and a vertical color identification signal 1110 which was selected via the selector 1104 and passed through the phase correction circuit 1109.

The vertical color identification signal control circuit 1101 determines the initial value of the vertical color identification signal which conforms to the CCD specifications, based on the initial value setting control signal from the CPU and sets the initial value to the identification signal generator for Field A 1102 and the identification signal generator for Field B 1103. In case the vide signal input is made in the normal mode, the identification signal generator for Field A 1102 and the identification signal generator for Field B 1103 repeat the sequence of reset and inversion in specified timing, in synchronization with a horizontal synchronization signal. The vertical color identification signal control circuit 1101 determines the field of the video signal output from the sensitivity enhancement output based on the phase relationship between the horizontal synchronization signal and the vertical synchronization signal. The vertical color identification signal corresponding to the field of the video signal output from the sensitivity enhancement output is output with the selector switched as required. The selector 1104 is switched after determining the field of the video signal output from the sensitivity enhancement output depending on the multiple for sensitivity enhancement in the CCD storage sensitivity enhancement operation. A phase shift of 0.5 lines in image data caused by a certain magnitude of sensitivity enhancement must be corrected by using the phase correction circuit 1109.

As stated earlier, in the third embodiment of the invention, imaging apparatus having a video memory function is configured to generate a vertical color order identification signal corresponding to a read field and a read address according to an electronic enlargement control signal and a CCD storage sensitivity enhancement mode control signal, wherein the vertical color order identification signal can be reset to an initial value for each field via the CPU. This allows a vertical color identification signal corresponding to a video output signal to be automatically output from an output terminal only via a CCD storage sensitivity control signal from the CPU.

As understood from earlier description, according to the invention, imaging apparatus having a video memory function comprises: a video memory having a plurality of read ports and a capacity of storing images in two fields or more, wherein CCD storage sensitivity enhancement means is connected to a write port; a write control circuit for storing a single-field image in each memory area provided by dividing the storage space of the video memory into a plurality of sub-spaces; a plurality of read control sections for reading a single-field image stored in each memory area; memory control means for reading an image from the video memory by a delay amount corresponding to the timing of a synchronization signal from the CCD storage sensitivity enhancement means; electronic enlargement means; vertical inversion read means; and noise reduction means. This configuration provides an advantage that a combination of the cyclic noise reduction feature, CCD sensitivity enhancement feature, electronic enlargement feature and vertical inversion processing can be realized without inversion of the time order of images.

Also provided are means for automatically determining an input image field based on a horizontal synchronization signal and a vertical synchronization signal and means for setting a memory area where image data is to be written depending on a sensitivity enhancement control signal from the CPU. This configuration has an advantage that a bank used for storing images in the frame memory can be automatically determined only via a CCD storage sensitivity enhancement control signal from the CPU.

Also provided is a circuit for generating a vertical color order identification signal corresponding to a read field and a read address according to an electronic enlargement control signal and a CCD storage sensitivity enhancement mode control signal, wherein the vertical color order identification signal can be reset to an initial value for each field via the CPU. This configuration provides an advantage that a vertical color identification signal can be generated corresponding to a video output signal only via a CCD storage sensitivity control signal from the CPU.

What is claimed is:

1. Imaging apparatus having a video memory function, comprising:

CCD storage sensitivity enhancement means; a video memory having a plurality of read ports and a capacity of storing images in two fields or more wherein said CCD storage sensitivity enhancement means is connected to a write port;

a write control circuit for storing a single-field image in each memory area provided by dividing the storage space of said video memory into a plurality of subspaces;

a plurality of read control sections for reading a single-field image stored in each of said memory areas; and memory control means for reading an image from said video memory by a delay amount corresponding to the timing of a synchronization signal from said CCD storage sensitivity enhancement means.

2. Imaging apparatus having video memory function according to claim 1, further comprising electronic enlargement means connected to said read ports.

3. Imaging apparatus having video memory function according to claim 1, further comprising vertical inversion read means connected to said read ports.

4. Imaging apparatus having a video memory function according to claim 1, further comprising noise reduction means connected to said read ports.

5. Imaging apparatus having a video memory function according to any one of the preceding claims, further comprising means for automatically determining an input image field based on a horizontal synchronization signal and a vertical synchronization signal, a CPU for outputting a sensitivity enhancement signal, and means for setting a memory area where image data is to be written depending on said sensitivity enhancement control signal.

6. Imaging apparatus having a video memory function according to claim 5, further comprising a circuit for generating a vertical color order identification signal corresponding to a read field and a read address according to an electronic enlargement control signal from said electronic enlargement means and a CCD storage sensitivity enhancement mode control signal from said vertical inversion read means and that said apparatus has means for resetting said vertical color order identification signal to an initial value for each field via the CPU.

7. Imaging apparatus having a video memory function, comprising: CCD storage sensitivity enhancement means for outputting a synchronization signal; and a video memory having a capacity of storing images in two or more memory areas;

a write control circuit for storing a single-field image in each memory area, and for inputting said synchronization signal;

a first read port connected to said write control circuit and having a first read area control signal input and also inputting said synchronization signal;

a second read port connected to said write control circuit and having both a second read area control signal input and a read address setting terminal input and also inputting said synchronization signal;

a plurality of read control sections for reading a single-field image stored in each of said memory areas; and memory control means for reading an image from said video memory by a delay amount corresponding to a timing of said synchronization signal.

8. Imaging apparatus having a video memory function, comprises: a video memory having a plurality of read ports and a capacity of storing images in two fields or more wherein CCD storage sensitivity enhancement means is connected to a write port;

a write control circuit for storing a single-field image in each memory area provided by dividing the storage space of said video memory into a plurality of subspaces;

a plurality of read control sections for reading a single-field image stored in each of said memory areas;

memory control means for reading an image from said video memory by a delay amount corresponding to the timing of a synchronization signal from said CCD storage sensitivity enhancement means;

means for automatically determining an input image field based on a horizontal synchronization signal and a vertical synchronization signal;

a CPU for outputting a sensitivity enhancement signal; and means for setting a memory area where image data is to be written depending on said sensitivity enhancement control signal.

9. An imaging apparatus having a video memory function according to claim 8, further comprising a circuit for generating a vertical color order identification signal corresponding to a read field and a read address according to an electronic enlargement control signal from said electronic enlargement means and a CCD storage sensitivity enhancement mode control signal from said vertical inversion read means and that said apparatus has means for resetting said vertical color order identification signal to an initial value for each field via the CPU.

* * * * *